Sept. 18, 1973 RAYMOND C. WANG 3,759,763

METHOD OF PRODUCING LOW THRESHOLD COMPLEMENTARY INSULATED GATE FIELD EFFECT DEVICES

Filed June 21, 1971

2 Sheets-Sheet 1

INVENTOR
Raymond C. Wang
BY
Mueller & Aichele
ATTY'S.

INVENTOR
Raymond C. Wang
BY
Mueller & Aichele
ATTY'S.

3,759,763

METHOD OF PRODUCING LOW THRESHOLD COMPLEMENTARY INSULATED GATE FIELD EFFECT DEVICES

Raymond C. Wang, Tempe, Ariz., assignor to Motorola, Inc., Franklin Park, Ill.

Filed June 21, 1971, Ser. No. 154,991
Int. Cl. H01l 7/50
U.S. Cl. 148—188 6 Claims

ABSTRACT OF THE DISCLOSURE

It is advantageous to have low gate threshold voltage transistors exhibiting high stability. If the surface concentration of P-type impurities of an N-type insulated gate field effect transistor (IGFET) channel between the $N^+$ doped source and drain is in the order of $6\times10^{15}$ atoms per cu. cm. or less, and using a polysilicon gate electrode, the gate threshold voltages will be about one volt. Furthermore, if the complementary transistors are carefully cleaned during production thereof and a gettering step is provided, the resultant C-IGFET's have high stability. A method including the measured etching away of the surface of a P-type diffused area is disclosed for providing a region or tub of $6\times10^{15}$ P-impurity concentration in an N-type substrate. A method is also disclosed for providing a highly stable C-IGFET using the so produced tub including cleaning and gettering.

BACKGROUND

Figure 1:
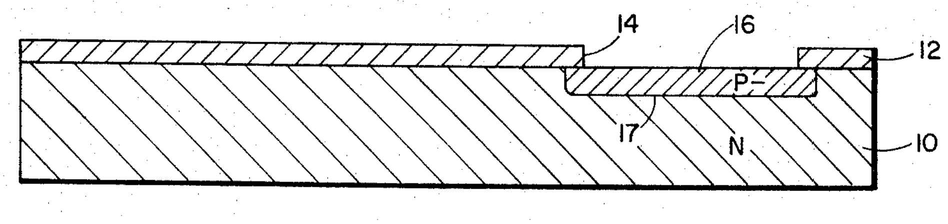

This invention relates to a method of making complementary low threshold voltage insulated gate field effect transistors, hereinafter C-IGFET's.

It is known that insulated gate field effect transistors can be built using, for example, an N-type substrate having a P region or tub therein. Separate $N^+$ regions are provided in the P tub, the separated $N^+$ regions being the drain and the source of a N-channel transistor and the surface portion of the P tub between the drain and source being the channel thereof. The adjacent part of the N-type substrate outside of the P tub has small separate $P^+$ regions diffused therein to provide an IGFET of the complementary type, whereby complementary IGFET's are provided in the same substrate.

It has been found that the greater the P-type concentration in the channel portion of the tub, the higher the threshold voltage that must be applied to the insulated gate to start current flowing between the source and drain regions in the tub. This follows due to the fact that the channel is inverted, in effect, from P to N material by the voltage on the gate to start conduction in the channel. The higher the P concentration in the channel, the more voltage must be applied to the gate to invert the P channel to N material. Using prior art methods of providing a $P^-$ tub in an N substrate, these methods being explained below, the lowest concentration in the channel area of the P tub of P-type impurity material that can be provided is in the order of $3.5\times10^{16}$ atoms per cu. cm. This P impurity concentration results in a threshold voltage of about two volts. It has been calculated that if this P impurity concentration can be reduced to about $6\times10^{15}$ atoms per cu. cm. and using a polysilicon gate electrode, that the threshold voltage would be less than one volt.

When IGFET's which are either of the P-type or of the N-type are completed by the known process, using, however, the tub having reduced P-type impurity concentration, the IGFET's so provided lack stability. This lack of stability, it is considered, is due to impurities in the interface between the gate insulation and the surface of the substrate and also between the gate insulation and the gate electrode. These impurities are introduced into these interfaces during the fabrication of the IGFET's. This lack of stability may also be due to a strain developed in the substrate during the several construction steps.

It is an object of this invention to provide a tub of P-type semiconductor material in a substrate of N-type semiconductor material having a lower concentration of P-type impurities in a surface portion thereof than in known such devices.

It is another object of this invention to provide a method for producing a tub of P-type semiconductor material of such lower impurity concentration.

It is a further object of this invention to provide an N-type IGFET having a gate threshold voltage in the order of one volt and to provide the method of making the channel portion thereof.

It is a still further object to provide methods of cleaning away impurities in a substrate or in diffusions therein.

It is still another object to provide a gettering method for removing impurities for the substrate or in diffusions therein.

SUMMARY

It is known to diffuse P-type impurities into a surface of an N-conductivity type silicon substrate to produce a P region having maximum P impurities concentrated on the surface and very quickly falling off concentration of impurities in a direction away from the surface. According to the known method, a layer of silicon oxide is provided on the surface of the substrate to act as a stop for out-diffusion. Then the concentration of impurities is reduced by heating the substrate to drive the P impurities more deeply into the substrate, in a known manner. This known drive-in step reduces the concentration of the P impurities by increasing the depth of the P region. The oxide layer is etched off and another oxide layer is applied to the surface of the substrate and then the drive-in step is repeated, again increasing the depth of the P region. The reason for etching off the first oxide layer is to remove the P-type impurities which have diffused into the first oxide layer during the first drive-in step. The second oxide layer then acts as an efficient sink for more P-type impurities during the second drive-in step, thereby contributing to the overall objective of achieving low impurity concentration in the P-type region. Upon repeated drive-in steps, a surface concentration of the P impurities of about $3.5\times10^{16}$ atoms per cu. cm. is realized, and the total depth of the P region reaches to about ten microns. Due to the lessened density of the P impurites, the time taken for further drive in steps to reduce the P impurity concentration to the desired value of about $6\times10^{15}$ atoms per cu. cm. is greatly increasd. Due to the time required, the drive-in method for producing the required impurity concentration is impractical.

According to this invention, after one or more drive-in steps, the upper surface of the substrate is removed as by etching to a depth such that the portion of the P region or tub that remains, where the channel of the N-type IGFET is to be, has a P impurity surface concentration of the desired amount of about $6\times10^{15}$. In this etching step, about seven microns of the surface of the substrate are removed, leaving a depth of about three microns of the P region. Since the effective depth of the channel region is about eight-tenths of a micron, the tub of P type material not only has the proper surface concentration, but the depth of the tub is ample for the purpose of providing an N-type IGFET.

IGFET's so produced, while having low gate threshold voltage value, exhibit instabilities. It is thought that the instabilities are due to impurities to which they are subjected during the steps of constructing them. The instabilities may also be due to strain imposed on the substrate or on the several layers thereon during the several diffusion and layer growing steps. Further, in accordance with this invention, to reduce instability of the resultant IGFET's, the substrate is cleaned before each diffusion in a chromic acid cleaning and in a hydrogen fluoride cleaning solution. After the $P^+$ diffusion of the substrate, the substrate is cleaned in a dilute hydrogen fluoride cleaning bath before and after a nitric acid cleaning. Furthermore, the substrate is cleaned after the $N^+$ diffusion thereof by being dipped in the buffered hydrogen fluoride cleaning solution. In each case the substrate is washed with distilled water. Furthermore, an annealing step and a step of coating with a gettering material on the side of the substrate into which the diffusion takes place is provided. The cleaning, annealing and gettering steps result in the production of high stability IGFET's.

DESCRIPTION

Figure 3:
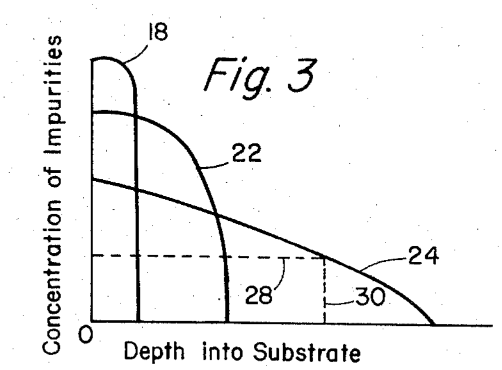
Figure 2:
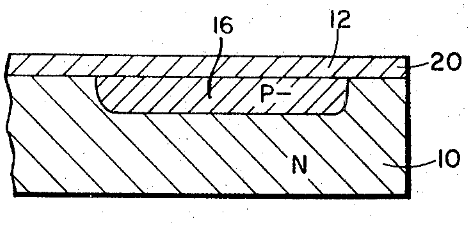
Figure 4:
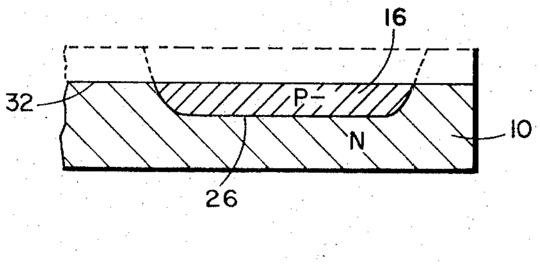

The invention will be better understood upon reading the following description in connection with the accompanying drawing in which FIGS. 1 and 2 illustrate a known method of diffusing impurities of P-type in an N substrate, FIG. 3 is a graph which is useful in explaining the known method and also the method of this invention, FIG. 4 illustrates the method of providing a low P-type impurity tub of this invention, and FIGS. 5 through 8 illustrate the method of providing C-IGFET's of this invention, using the tub of FIG. 4.

Turning first to FIG. 1, an N-type semiconductor silicon substrate 10 is illustrated including a layer 12 of silicon oxide, coated on a surface thereof. Silicon oxide formed by the thermal oxidation of silicon is represented by the formula $SIO_x$ where $x$ is a number from 1.7 to 3. If the oxide layer formed herein is formed by chemical vapor deposition, a $SIO_2$ layer is formed. The term silicon oxide is meant to include both types. A hole 14 is provided in the silicon oxide coating 12. P-type material is diffused into the surface of the substrate 10 through the hole 14 to form a P-conductivity type tub 16. An N-type IGFET may be made using the tub 16. A P-type IGFET device may be provided in other parts of the substrate 10 either simultaneously with the device that is to be produced in a region 16 or at a different time.

The concentration of the P-type material in the tub 16 which is diffused into the substrate 10 is very high as shown by the curve 18 of FIG. 3. The P-type concentration falls off very rapidly at the bottom of the tub, also as shown in FIG. 3. The bottom of the tub is a PN junction 17 where the P-type and N-type impurities are equal in concentrations.

The concentration of the P-type material in the tub 16 is reduced by the known drive-in manner. A layer 20 of silicon oxide is grown over the P tub 16 (see FIG. 2) as well as over the rest of the substrate 10. Then the substrate is heated to the drive-in temperature. While heating, the depth of the tub increases, thereby decreasing the P-type concentration at the surface of the substrate 10. This is shown by the curve 22 in FIG. 3. The oxide layer 20 prevents out-diffusion of the P-type impurity. The maximum P-type concentration is less, the depth of the tub is greater, and the fall-off of concentration with depth is more gradual for the curve 22 than for the curve 18. Then the oxide layer 20 is etched off and another oxide layer, not shown, is thermally grown on the substrate 10 and the drive-in step is repeated. The concentration curve 24 for P-type material in the substrate 10 is now obtained. It is noted that the maximum P-type concentration as shown by the curve 24 is at the surface. In a practical case, this concentration is about $4\times10^{16}$ atoms per cu. cm. The minimum concentration, indicated by the solid line 26 of FIG. 4 and the dotted continuation thereof, has a maximum depth, in a practical case, of about ten microns. It is noted that curve 24 shows a gradual fall off of concentration with depth. By assuming that the curve 24 has the shape of a Gauss curve, it is easy to calculate that the desired concentration of about $6\times10^{15}$, shown by the dotted line 28 of FIG. 3, occurs at a depth of about seven microns, as indicated by the dotted line 30. Therefore, upon etching away the upper part of the substrate 10 to the line 32, see FIG. 4, the concentration of P-impurities in the tub 16 below the line 32 is about $6\times10^{15}$ or less. Furthermore, the maximum depth of the tub 12 is about three microns. Since the maximum depth of the source and drain that are diffused in spaced portions of the tub is about eight-tenths of a micron deep, the concentration of the P-impurities in the channel portion of the tub 16 between the source and the drain has the desired concentration of about $6\times10^{15}$ and the IGFET's there formed using the tub 16 has a gate threshold voltage of about one volt. While the useful etching is over the P-type portion of the substrate 10, it is usually convenient to etch away the whole surface of the substrate 10.

While a tub of P material of the desired low concentration is provided in a substrate of N material by the above method, the above method used with a P-type substrate having an N-type tub diffused therein provides a tub of the desired low concentration of N material in a P substrate.

Figure 5:
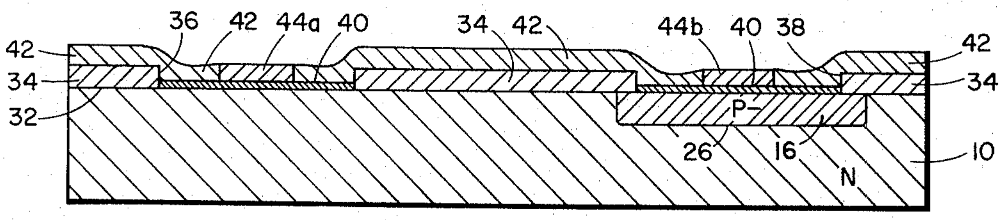
Figure 6:
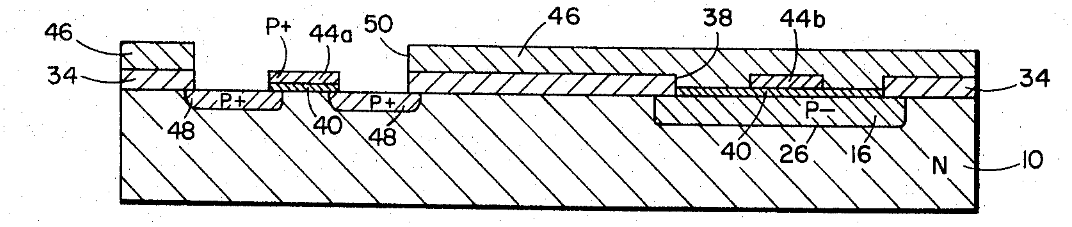

Using the substrate 10 with the low $P^-$ concentration tub 16 threin, C-IGFET's having high stability are provided as shown in FIGS. 5 through 8. Considering FIG. 5, a layer 34 of silicon oxide which is about 5000 angstrom units (A.) thick is applied over the whole surface 32 of the substrate 10. Then the parts of the surface of the substrate 10 comprising the P-IGFET and the N-IGFET are exposed by making holes 36 and 38 over the substrate 10 away from the tub 16 and over the tub 16 respectively. Then the gate oxidation layer 40 is provided in the holes 36 and 38. This gate oxidation 40 is thermally grown gate to about 800 A. thick and the oxide layer 34 becomes a little thicker. Then, still as shown in FIG. 5, a layer 42 of polysilicon which may be 4000 to 5000 A. thick is deposited over the whole top surface of the layer 34 and over the thermally grown gate layer 40. Then all the polysilicon 42 except the polysilicon portions which are to be gate electrodes **44*a* and 44*b*, and the polysilicon (not shown) which is to be electrical connections to the gate electrodes 44*a* and 44*b*, is removed. In this step, the exposed gate layers 40 at each side of the polysilicon gates 44*a* and 44*b* is not removed. Then, as shown in FIG. 6, a layer 46 of silicon oxide which is 2000 to 3000 A. thick is deposited on the whole surface, including on the layer 34, on the exposed portions of the gate layer 40, and on the remaining polysilicon gates 44*a* and 44*b* at a temperature of about 450° C. Then the location of the P-IGFET source and drain are defined, as shown in FIG. 6 by cutting the hole 50 in the glass 46. This leaves the gate polysilicon 44*a* and the gate insulation 40 under the gate polysilicon 44*a* but cuts through to the surface of the substrate 10, removing the gate insulation 40 that is not protected by the gate polysilicon 44*a***.

At this point the whole chip, including the substrate 10 and all the layers thereon, is cleaned by immersing the chip in chromic acid for 5 minutes, rinsing for 5 minutes in ultra-pure deionized water, rinsing for 5 seconds in a solution of 10 parts water and 1 part hydrofluoric acid, then rinsing for 10 minutes in ultra-pure deionized water. For convenience, this is called the first cleaning.

Then the whole chip is subjected to a $P^+$ diffusion using $BBr_3$ (boron tribromide) at 1000° C. for about 20 minutes, whereby the $P^+$ type drain and the source regions 48, 48 are produced in the N substrate 10 and the gate polysilicon, becomes $P^+$. The depth of the regions 48, 48 either of which can be the drain or the source of a P-channel IGFET, is about 0.5 micron. The gate insulation 40 is not effected since this $P^+$ diffusion does not extend through the gate polysilicon **44*a***. Then the whole chip is subjected to a cleaning step, which is called the second cleaning. The second cleaning comprises immersing the chip in a solution of 10 parts water and 1 part hydrogen fluoride for 10 seconds, rinsing in ultra-pure deionized water for 5 minutes, immersing in nitric acid for 5 minutes, immersing in the solution of water and hydrogen fluoride mentioned above for 5 seconds and rinsing with ultra-pure deionized water for 5 minutes.

Figure 7:
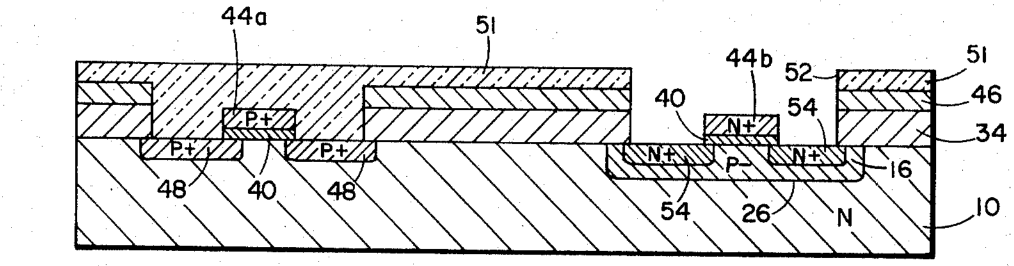
Figure 8:
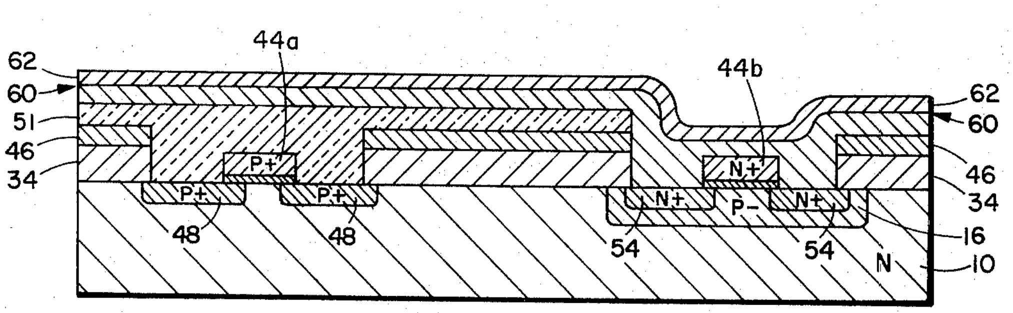

Then, as shown in FIG. 7, another layer 51 of glass is deposited over the whole surface of the chip at 450° mentary insulated gate field-effect transistor devices comprising the steps of:

forming an insulating layer on a surface of a semiconductor substrate of a first conductivity type;

etching an opening in said insulating layer exposing said substrate for forming a field-effect transistor therein;

forming a first diffused region having a high concentration of impurities of a second conductivity type by diffusing said impurities into said substrate through said opening;

heating said substrate to drive in said impurities to